United States Patent
Freidhof

(10) Patent No.: US 10,620,264 B2
(45) Date of Patent: Apr. 14, 2020

(54) MEASURING SYSTEM AS WELL AS METHOD FOR ANALYZING AN ANALOG SIGNAL

(71) Applicant: Rohde & Schwarz GmbH & Co. KG, Munich (DE)

(72) Inventor: Markus Freidhof, Kirchseeon (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 65 days.

(21) Appl. No.: 15/599,164

(22) Filed: May 18, 2017

(65) Prior Publication Data
US 2018/0335474 A1 Nov. 22, 2018

(51) Int. Cl.
| | |
|---|---|
| *G01R 31/316* | (2006.01) |
| *G01R 31/3177* | (2006.01) |
| *G01R 31/3167* | (2006.01) |
| *G01R 13/02* | (2006.01) |
| *G01R 13/22* | (2006.01) |
| *G01R 13/30* | (2006.01) |

(52) U.S. Cl.
CPC ........... *G01R 31/316* (2013.01); *G01R 13/02* (2013.01); *G01R 13/0245* (2013.01); *G01R 13/225* (2013.01); *G01R 13/30* (2013.01); *G01R 31/3167* (2013.01); *G01R 31/3177* (2013.01)

(58) Field of Classification Search
CPC .. G01R 13/02; G01R 13/0245; G01R 13/225; G01R 13/30; G01R 31/316; G01R 31/3167; G01R 31/3177
See application file for complete search history.

(56) References Cited

U.S. PATENT DOCUMENTS

| | | | |
|---|---|---|---|
| 2003/0005188 A1* | 1/2003 | Tehrani | G06F 3/0607 710/15 |
| 2003/0095099 A1* | 5/2003 | Azinger | G01R 13/30 345/157 |

FOREIGN PATENT DOCUMENTS

EP 1562131 A2 8/2005

* cited by examiner

*Primary Examiner* — Bryan Bui
(74) *Attorney, Agent, or Firm* — Christensen O'Connor Johnson Kindness PLLC

(57) ABSTRACT

A measuring system has an analog-to-digital converter, an acquisition memory, a processing unit, and a display memory. The processing unit is adapted to decode a digital signal according to a protocol creating a decoded signal and to evaluate the decoded signal at a cursor position. The digital data generated by decoding the decoded signal at the cursor position is stored in the display memory. Further, a method for analyzing an analog signal according to a protocol is shown.

21 Claims, 1 Drawing Sheet

MEASURING SYSTEM AS WELL AS METHOD FOR ANALYZING AN ANALOG SIGNAL

FIELD OF THE DISCLOSURE

Embodiments of the present disclosure relate generally to a measuring system having an analog-to-digital converter, an acquisition memory, a processing unit, and a display memory, as well as a method for analyzing an analog signal according to a protocol.

BACKGROUND

Measuring systems, e.g. oscilloscopes and logic analyzers, are known that decode the signals of a bus like a USBx, I2C, UART, SPI, LIN, FlexRay and CAN bus. These measuring systems decode the analog bus signal in order to extract the values of the signal data packages of the bus signal.

It is known to visualize the frames or packages of the decoded bus signal in a honeycomb-like shape. However, if the frames are short compared to the time base of the display of the measurement system, it is not possible to distinguish single frames. It is known to solve this problem using tables containing the frames and their values. However, identifying single frames or even packages in these tables is time consuming.

SUMMARY

Thus, there is a need to identify single frames and packages of a bus signal including the decoded value in a precise fashion.

To address this need, among others, the present disclosure provides a measuring system having an analog-to-digital converter for converting an analog signal into a digital signal, an acquisition memory for storing the digital signal, a processing unit, and a display memory. The processing unit being adapted to decode the digital signal according to a protocol creating a decoded signal and to store the decoded signal in the acquisition memory. The processing unit is adapted to evaluate the decoded signal at a cursor position generating digital data and to store the digital data of the position in the display memory.

Further, the disclosure provides a method for analyzing an analog signal according to a protocol using a measuring system, comprising the steps of:
converting the analog signal into a digital signal;
decoding the digital signal according to a protocol creating a decoded signal;
evaluating the decoded signal at a cursor position generating digital data; and
storing the digital data of the position in a display memory of the measuring system.

The cursor defining the cursor position may be associated with the decoded signal or a visualization thereof. Further, the cursor may be a track-cursor. By using the cursor position to identify the position of the decoded signal to be analyzed, it is possible to extract data from the digital signal precisely at that very position.

For providing a very versatile measuring system, the measuring system may be an oscilloscope or a logic analyzer.

For example, the cursor position is selected by a user of the measuring system. The cursor may be moved by the user to select the position of the digital signal to be decoded. This way, the user is provided with an easy and intuitive way of selecting the position speeding up the measurement process.

According to an embodiment, the protocol is a bus protocol. The protocol may be the USB protocol, the I2C protocol, the UART protocol, the SPI protocol, the LIN protocol, the FlexRay protocol, and/or the CAN protocol. This way, standard bus systems can be analyzed.

In an aspect, the digital data comprises the decoded value of at least one of a frame of the digital signal at the cursor position and a packet of the frame. Frames are also called telegrams. This way, it is possible to extract the decoded value of a desired frame or a desired packet to be investigated very precisely. The packets may be data packets, ID packets or the like as specified in the protocol.

In another embodiment, the measuring system comprises a display adapted to display the digital data. The digital data may be displayed in written form, e.g. in alphanumerical form. Thus, the desired decoded value of the desired frame or packet can be obtained quickly. The display may be connected to the display memory in order to display the data stored in the display memory. For example, the display has several portions or sections for displaying different data.

For quick and simple identification of the desired position to be decoded, the display may comprise a visualization section, the display being adapted to display at least one of the cursor position and a visualization of at least one of the analog signal, the digital signal, and the decoded signal in the visualization section. For example, the cursor may be associated with the visualization of a decoded signal. The cursor may further be visualized as a vertical line intersecting the signal visualizations.

In an aspect, the display being adapted to display the digital data outside of the visualization section for improved measurement speed.

In an embodiment, the processing unit is adapted to evaluate the decoded signal at a plurality of positions and to store a plurality of digital data generated allowing for comparisons of the digital data.

For a precise choice of the desired position, the display is adapted to display a plurality of digital data simultaneously. The display may have different portions or sections for the visualization of the digital data and/or decoded signals.

For improved and reliable signal processing, the decoded signal may be stored in an acquisition memory of the measuring system.

In another aspect, the decoded signal is evaluated at at least a second cursor position defined by at least a second cursor generating at least second digital data and storing the at least second digital data in the display memory. The second cursor may also be associated with visualizations of the decoded signal and may be a tracking-cursor.

Further, a digital data and the at least second digital data may be displayed simultaneously on the display.

In another aspect, it is possible to select different signals and to encode different signals simultaneously.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
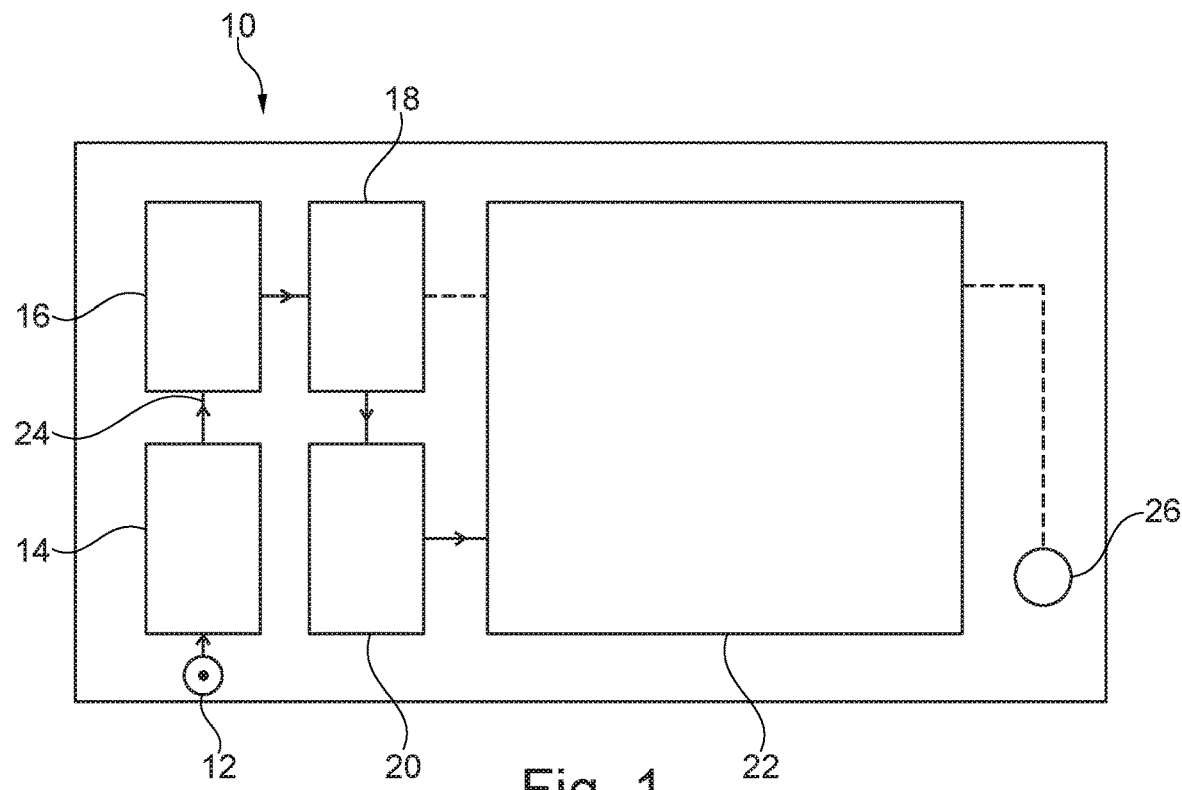
FIG. 1 shows a schematic overview of an embodiment of the measuring system.

FIG. 1 shows a measuring system 10, for example an oscilloscope or a logic analyzer. The measuring system 10 comprises an input 12, an analog-to-digital converter 14, an acquisition memory 16, a processing unit 18, a display memory 20, and a display 22.

A signal path 24 is provided by an electric connection originating from the input 12, running through the analog-to-digital converter 14 and the acquisition memory 16 to the processing unit 18. From the processing unit 18, the signal path proceeds to the display memory 20 and from the display memory to the display 22. Of course, more electric connections, wiring, signal paths or the like may be provided in the measuring system 10 but are not shown for simplification.

Further, the measuring system 10 comprises an input device 26, for example a knob or a button, electrically or wirelessly connected to the processing unit 18. Naturally, the input device can also be any other human interface device like a mouse or a touch surface. For example, the display 22 can be a touch screen.

For measuring an analog signal according to a protocol, the input 12 is connected to the signal lines (not shown) carrying the analog signal to be measured.

The analog signal is fed to the analog-to-digital converter 14 that converts the analog signal into a digital signal $S_1$ (FIG. 2), i.e. a digital representation thereof. This digital signal $S_1$ is then transferred to the acquisition memory 16 and may be stored in the acquisition memory 16.

The processing unit 18 may be a microprocessor having access to the acquisition memory 16 and/or to a memory of the processing unit 18 itself. The processing unit 18 has access to or may request the protocol used to create the analog signal. The protocol may be a bus protocol, for example the USB protocol, the I2C protocol, the UART protocol, the SPI protocol, the LIN protocol, the FlexRay protocol or the CAN protocol. With the information of the protocol, the processing unit is able to decode the analog signal, or more precisely, the digital signal $S_1$ created on the basis of the analog signal. For decoding, the processing unit 18 obtains the digital signal $S_1$ from the acquisition memory 16.

The signal according to the protocol includes frames or telegrams comprising several packages of information. The packages may be identification packages (ID-packages), data packages containing the information to be transmitted, or other packages.

The processing unit 18 is able to decode the frame and/or the single packages by using the information about the protocol. This way, the processing unit 18 obtains a decoded signal $S_2$ (FIG. 2), i.e. the information contained in the frames or packages.

The decoded signal $S_2$ may be stored in the display memory 20 alongside with the digital signal $S_1$, i.e. a digital representation of the analog signal. The decoded signal $S_1$, the digital signal $S_1$ and possibly the analog signal may be displayed on the display 22 as can be seen in FIG. 2.

Figure 2:
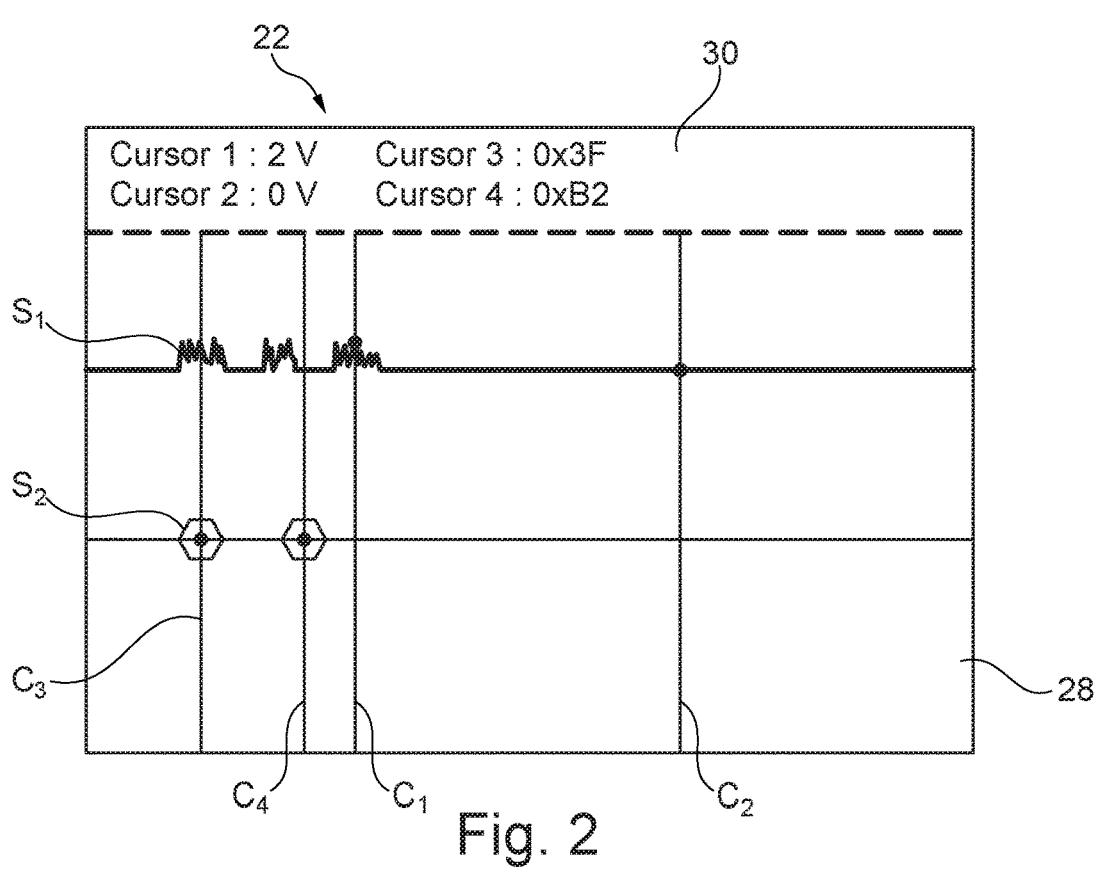
FIG. 2 shows the display of the measuring system according to FIG. 1 during operation.

FIG. 2 shows the display 22 of the measuring system 10 while analyzing an analog signal according to a protocol. The display 22 displays data, signals, and information stored in the display memory 20 and comprises several portions or sections including at least a visualization section 28 and a data section 30 lying outside of the visualization section 28.

The digital signal $S_1$ and the decoded signal $S_2$ are shown in the visualization section 28 as visualizations. The digital signal $S_1$ corresponding to the analog signal may be visualized as a plot of the signal, e.g. a voltage over time diagram. The decoded signal $S_2$ comprises several frames and packages that are visualized as honeycombs or elongated honeycombs on the same time scale as the digital signal $S_1$ is visualized.

Further, several cursors are displayed by the display 22 and may be track-cursors. In the example shown in FIG. 2, four cursors $C_1$, $C_2$, $C_3$ and $C_4$ are shown. The first cursor $C_1$ ("Cursor 1") and the second $C_2$ ("Cursor 2") are associated with the digital signal $S_1$, whereas the third cursor $C_3$ ("Cursor 3") and the fourth cursor $C_4$ ("Cursor 4") are associated with the encoded signal $S_2$. Thus, the cursors $C_1$, $C_2$, $C_3$, $C_4$ mark a position, the so called cursor position, of the digital signal $S_1$ and the decoded signal $S_2$, respectively.

The cursors are visualized as a vertical line intersecting with the visualizations of the digital signal $S_1$ and the decoded signal $S_2$. The cursors may be moved in the horizontal direction, i.e. along the time axis using the input device 26, e.g. by turning the knob. Thus, the user of the measuring system 10 may place one of the cursors at a specific point in time by selecting the cursor position to correspond to that point in time.

In the data section 30, a data field for each cursor $C_1$, $C_2$, $C_3$ and $C_4$ is provided.

For the first cursor $C_1$ and the second cursor $C_2$ associated with the digital signal $S_1$, the voltage value of the digital signal $S_1$ at the cursor position is displayed in the data section 30 of the display 22. For the third cursor $C_3$ and the fourth cursor $C_4$ associated with the decoded signal $S_2$, the processing unit 18 evaluates the decoded signal $S_2$ at the respective cursor positions and generates digital data. In the shown example, the processing unit 18 determines simultaneously the value of the frame or the package of the decoded signal $S_2$ at the cursor position of the third cursor $C_3$ and the fourth cursor $C_4$, respectively.

These decoded values are the digital data generated in the decoding of the decoded signal $S_2$. Of course, this digital data may also comprise other information generated while evaluating the decoded signal $S_2$.

The digital data is then transferred to the display memory 20 and stored in the display memory 20. Subsequently, the display 22 displays the digital data in the data section 30.

The digital data, in this case the decoded values, is displayed in written alphanumerical form.

In the shown embodiment, the decoded values of the frame or the package at the respective cursor position of the cursors $C_3$, $C_4$ are displayed in the data section 30. For example, the decoded value of the package and the cursor position of the third cursor $C_3$ is 0x3F and the decoded value of the package at the cursor position of the fourth cursor $C_4$ may be 0xB2. Thus, first and second digital data has been generated and is displayed simultaneously on the display 22.

Therefore, the processing unit 18 may evaluate the decoded signal at a plurality of positions and store the respective plurality of digital data generated in the display memory 20. Likewise, the display 22 is adapted to display the plurality of digital data simultaneously.

The user may obtain the value of a specific frame or a specific package of the decoded signal $S_2$ by moving the third or fourth cursor $C_3$, $C_4$ and placing the cursor position at the frame to be analyzed. The cursor positions of the third or the fourth cursor $C_3$ or $C_4$ may be moved using the input device 26, e.g. by turning the knob. Thus, data analysis is simplified.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measuring system, comprising:
   an analog-to-digital converter configured for converting an analog signal into a digital signal;
   an acquisition memory configured for storing said digital signal;
   a processing unit configured to decode said digital signal according to a selected protocol in order to create a decoded signal, the processing unit further configured to store said decoded signal;
   a display memory; and
   a display configured to display a visualization of said digital signal and a visualization of said decoded signal, wherein said visualizations of said digital signal and said decoded signals are provided over time or use the same timescale,
   wherein said processing unit is further configured to evaluate said decoded signal at a time associated with a cursor position and generate representative digital data based on said decoded signal at said time associated with said cursor position, and configured to store said representative digital data in said display memory.

2. The measuring system according to claim 1, wherein said measuring system is an oscilloscope or a logic analyzer.

3. The measuring system according to claim 1, wherein said cursor position is selected by a user of said measuring system.

4. The measuring system according to claim 1, wherein said protocol is a bus protocol.

5. The measuring system according to claim 1, wherein said digital data comprises a decoded value of at least one of a frame of said digital signal at said time associated with said cursor position or a packet of said frame.

6. The measuring system according to claim 1, wherein said display comprises a visualization section, said display being configured to display at least one of said cursor position and at least one of a visualization of said analog signal, said visualization of said digital signal, or said visualization of said decoded signal in said visualization section.

7. The measuring system according to claim 6, wherein said display is configured to display said digital data outside of said visualization section.

8. The measuring system according to claim 1, wherein said processing unit is configured to evaluate said decoded signal at a plurality of positions and to store a plurality of digital data generated.

9. The measuring system according to claim 8, wherein said display is configured to display a plurality of digital data simultaneously.

10. The measuring system according to claim 1, wherein said display is configured to display said visualization of said decoded signal on the same time scale as said visualization of said digital signal.

11. A method for analyzing an analog signal using a measuring system, comprising:
    converting, by an analog-to-digital converter, said analog signal into a digital signal;
    storing said digital signal in an acquisition memory;
    decoding, by a processing unit, said digital signal according to a selected protocol thereby creating a decoded signal;
    displaying, by a display, a visualization of said digital signal and a visualization of said decoded signal, wherein said visualizations of said digital signal and said decoded signals are provided over time or use the same timescale;
    evaluating said decoded signal at a time associated with a cursor position and generating digital data representative of said decoded signal at said time associated with said cursor position; and
    storing said digital data of said position in a display memory of said measuring system.

12. The method according to claim 11, wherein said decoded signal is stored in the acquisition memory.

13. The method according to claim 11, wherein said cursor position is selected by a user of said measuring system.

14. The method according to claim 11, wherein at least one of said cursor position and at least one of a visualization of said analog signal, said visualization of said digital signal or said visualization of said decoded signal is displayed in a visualization section of said display.

15. The method according to claim 14, wherein said digital data is displayed outside of said visualization section.

16. The method according to claim 11, wherein said protocol is a bus protocol.

17. The method according to claim 11, wherein said digital data comprises a decoded value of at least one of a frame of said digital signal at said time associated with said cursor position or a packet of said frame.

18. The method according to claim 11, wherein said decoded signal is evaluated at at least a second cursor position defined by at least a second cursor generating at least second digital data and storing said at least second digital data in said display memory.

19. The method according to claim 18, wherein said digital data and said at least second digital data are displayed simultaneously on said display.

20. The method according to claim 11, wherein said visualization of said decoded signal is displayed on the same time scale as said visualization of said digital signal.

21. A measuring system, comprising:
- an analog-to-digital converter configured for converting an analog signal into a digital signal;
- an acquisition memory configured for storing said digital signal;
- a processing unit configured to decode said digital signal according to a selected protocol in order to create a decoded signal;
- a display memory; and
- a display configured to display a visualization of said digital signal and a visualization of said decoded signal, wherein said visualizations of said digital signal and said decoded signals are provided over time or use the same timescale,
- wherein said processing unit is further configured to evaluate said decoded signal at a time associated with a cursor position by determining a value of a frame or a package of the digital signal at said time associated with said cursor position and generating digital data representative thereof, the processing unit further configured to store said digital data in said display memory.

\* \* \* \* \*